United States Patent
Yang et al.

(10) Patent No.: US 6,426,016 B1
(45) Date of Patent: Jul. 30, 2002

(54) METHOD FOR ETCHING PASSIVATION LAYERS AND ANTIREFLECTIVE LAYER ON A SUBSTRATE

(75) Inventors: Cheng-Jui Yang, Taipei; Chang-Hsien Wang, Hsinchu; Hwang-Ming Chen, I-Lan Hsien; Hu-Ching Lin, Hsinchu, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/369,265

(22) Filed: Aug. 6, 1999

(51) Int. Cl.$^7$ ............................................. H01L 21/00
(52) U.S. Cl. .................... 216/79; 438/706; 438/723; 438/724; 438/738
(58) Field of Search .................... 216/79; 438/706, 438/723, 724, 738, 744, 743

(56) References Cited

U.S. PATENT DOCUMENTS

| | | | | |
|---|---|---|---|---|
| 4,374,698 A | * | 2/1983 | Sanders et al. | 438/724 |
| 4,529,476 A | * | 7/1985 | Kawamoto et al. | 438/724 |
| 5,162,259 A | * | 11/1992 | Kolar et al. | 438/642 |
| 5,658,425 A | * | 8/1997 | Halman et al. | 438/620 |
| 5,846,880 A | * | 12/1998 | Lee | 438/669 |
| 5,872,062 A | * | 2/1999 | Hsu | 438/720 |
| 5,961,791 A | * | 10/1999 | Frisa et al. | 204/192.1 |
| 5,970,373 A | * | 10/1999 | Allen | 438/624 |
| 6,117,351 A | * | 9/2000 | Li et al. | 216/99 |

* cited by examiner

*Primary Examiner*—Randy Gulakowski
*Assistant Examiner*—Shamim Ahmed
(74) *Attorney, Agent, or Firm*—Nath&Associates PLLC; Harold L. Novick

(57) ABSTRACT

A method to etch passivation layers and an antireflective layer on a substrate, comprising: forming a metal layer on the substrate; forming the antireflective layer on the metal layer; forming the passivation layers on the antireflective layer, wherein the passivation layer consisting of a silicon oxide layer on the antireflective layer and a silicon nitride layer on the silicon oxide layer; etching the silicon nitride layer in a first etching chamber, wherein the silicon nitride layer is etched in a uniformity of less than 10% in the first etching chamber; etching the silicon oxide layer in a second etching chamber, wherein the silicon oxide layer is etching in a uniformity of less than 5% in the second etching chamber; etching the antireflective layer in the second etching chamber to expose a surface of the metal layer for metal contacts of integrated circuits.

10 Claims, 2 Drawing Sheets

METHOD FOR ETCHING PASSIVATION LAYERS AND ANTIREFLECTIVE LAYER ON A SUBSTRATE

FIELD OF THE INVENTION

The present invention relates to a method to etch a passivation layer and an antireflective layer on a substrate, more particularly, to a method of etching a passivation layer and an antireflective layer on a substrate in various etching chambers during a metal contact process of a device.

BACKGROUND OF THE INVENTION

The invention relates to the prevention of pad discolor effect of a metal layer after the etching of passivation layers and an antireflective coating formed thereon.

A metal layer is formed over the whole surface of a substrate composed of a silicon wafer. The metal layer is composed of thin films of Aluminum or thin films of an alloy in which silicon (Si) or Copper (Cu). The surface of the substrate on which the wiring layer is formed is generally covered with an insulating layer composed of $SiO_2$, etc. The surface of the substrate or a lower layer of wiring is exposed inside a contact hole provided on a part of the insulating layer. To prevent an increase in contact resistance of an aluminum or aluminum alloy thin film wiring due to an alloy reaction with a silicon wafer, a so-called barrier metal of thin film of Ti, TiN or TiW is provided between the silicon wafer and the aluminum thin film.

Referring to FIG. 1, a semiconductor structure 100 is provided and a metal layer 110 is formed on the semiconductor structure 100. The metal layer 110 is served as metal lines of integrated circuits formed in the semiconductor structure 100 and it will be exposed after passivation layers of integrated circuits are defined for metal contact. After the metal layer 110 is formed on the semiconductor structure 100, an antireflective layer 120 is formed on the metal layer for reducing reflectivity during following photolithography processes. In general, the antireflective layer 120 is formed of TiN material.

Still referring to FIG. 1, a silicon oxide layer 130 is formed on the antireflective layer 120 and a silicon nitride layer 140 is formed on the silicon oxide layer 130. The composing structure of the silicon oxide layer 130 and the silicon nitride layer 140 is indicated as a passivation layer of integrated circuits fabricated in the semiconductor structure 100.

After the passivation layer is formed on the antireflective layer 120, an etching process is performed to expose the portion surface of the metal layer 110 for metal contact or pad contact of integrated circuits. The passivation layer and the antireflective layer 120 are etched in the etching process. In a conventional technique, the etching process is a two-step process and the first step of the etching process is firstly performed to remove the passivation layer, as shown in FIG. 2. Referring to FIG. 3, the antireflective layer 120 is removed from the surface of the metal layer 110 in the second step of the etching process.

In the prior art, the etching of the passivation layer and the antireflective layer 120 is implemented in various chambers. The passivation layer consisting of the silicon nitride layer 140 and the silicon oxide layer 130 is etched in etching equipment, which is called as TEL5000. In the TEL5000 etching equipment, the etching rate of the silicon nitride layer 140, which is deposited by using a plasma enhanced chemical vapor deposition (PECVD) process, has an uniformity of between about 15% to 75%. Moreover, the etching rate of the silicon oxide layer 130 in TEL5000 has a uniformity of between about 6% to 15%. The etching of the silicon nitride layer 140 and the silicon oxide layer 130 is not uniform enough, because the uniformity of the etching rate of these layers is not good enough. As the passivation layer around the center of the wafer that is the passivation layer deposited thereon is just etched, there is oxide residue at the peripheral regions of the wafer. Furthermore, the layer near the peripheral regions of the wafer is just etched; the silicon oxide layer 130 near the center of the wafer could be damaged.

In other words, the silicon nitride layer 140 and the silicon oxide layer 130 are etched in a single chamber, polymer formed in the chamber during the etching process of the silicon oxide layer 130 is different with that formed during the etching process of the silicon nitride layer 140. The polymer that formed during the etching process of the silicon nitride layer 140 and the silicon oxide layer 130 will be difficult to form on the walls of the chamber and there becomes a particle issue in following etching processes.

In addition, the uniformity of the etching rate of the passivation layer is not good enough so as that there is silicon oxide residue on the antireflective layer 120. The silicon oxide residue on the antireflective layer 120 prevents the partial portion of the antireflective layer 120 from etching; the metal layer 110 can not be completely exposed. That is called as pad discolor effect. In general, the antireflective layer 120 is removed in another chamber that is different to the chamber which the passivation layer is etched therein.

Thus, there is a need to etch the silicon nitride layer and the silicon oxide layer of the passivation layer in a uniform etching rate so as to prevent the metal layer under the passivation layer from the pad discolor issue.

SUMMARY OF THE INVENTION

A method to etch a passivation layer and an antireflective layer on a substrate, comprising: forming a metal layer on the substrate; forming the antireflective layer on the metal layer; forming the passivation layers on the antireflective layer, wherein the passivation layer consisting of a silicon oxide layer on the antireflective layer and a silicon nitride layer on the silicon oxide layer; etching the silicon nitride layer in a first etching chamber, wherein the silicon nitride layer is etched in a uniformity of less than 10% in the first etching chamber; etching the silicon oxide layer in a second etching chamber, wherein the silicon oxide layer is etching in a uniformity of less than 5% in the second etching chamber; etching the antireflective layer in the second etching chamber to expose a surface of the metal layer for metal contacts of integrated circuits.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method to etch a passivation layer and an antireflective layer on a substrate, more particularly, to a method of etching a passivation layer and an antireflective layer on a substrate in various etching chambers during a metal contact process of a device.

A substrate is provided for the base of integrated circuits. A metal layer is formed on the substrate and it serves as the metal interconnection of the integrated circuits. An antireflective layer is formed on the substrate and a passivation layer is formed on the antireflective layer. In general, the passivation layer consists of a silicon oxide layer on the antireflective layer and a silicon nitride layer on the silicon oxide layer.

In the present invention, the passivation layer and the antireflective layer are etched to expose the surface of the metal layer for the pad contact of the integrated circuits. The silicon nitride layer is firstly etched in a first chamber by using an etcher and the etching rate of the silicon nitride layer in the first etching chamber has uniformity less than 10%. After the etching process of the silicon nitride layer, the silicon oxide layer of the passivation layer is etched in a second etching chamber and the etching rate of the silicon oxide layer has uniformity less than 5%. The antireflective layer, which is formed of TiN material, is etched in the second etching chamber and it can be completely removed because there is no silicon oxide residue on the antireflective layer.

The present invention will be described in detail with reference to the accompanying drawings.

In the following description numerous specific details are set forth such as flow rates, pressure settings, thickness, etc., in order to provide a more thorough understanding of the present invention. It will be obvious, however, to one skilled in the art that the present invention may be practiced without these details. In other instances, well known process has not be described in detail in order to unnecessary obscure the present invention.

Figure 1:
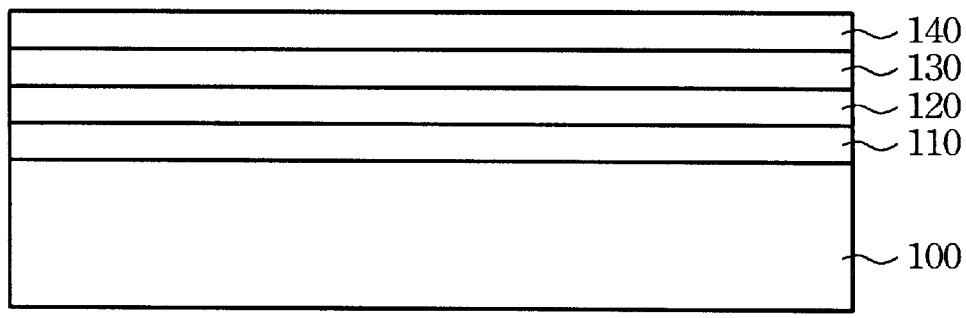
FIG. 1 shows a cross-section view of a substrate having a metal layer thereon, an antireflective layer on the metal layer and passivation layers on the antireflective layer in accordance with prior art.
Figure 2:
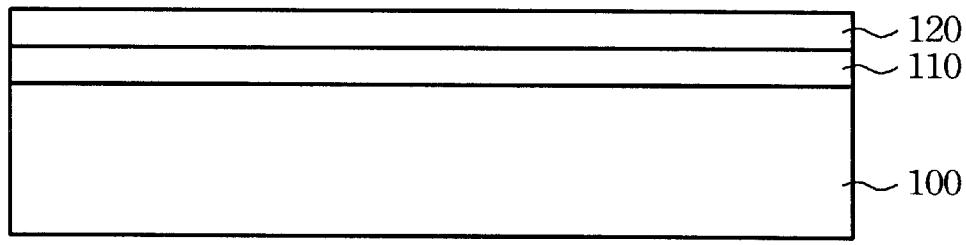
FIG. 2 shows a cross-section view of a substrate in accordance with prior art after the passivation layers are removed from the antireflective layer.
Figure 3:
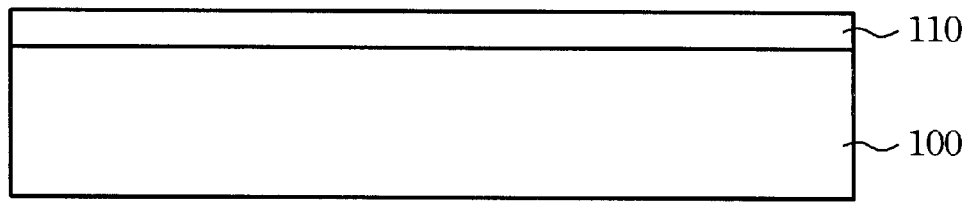
FIG. 3 shows a cross-section view of a substrate in accordance with prior art after the antireflective layer is removed from the metal layer.
Figure 4:
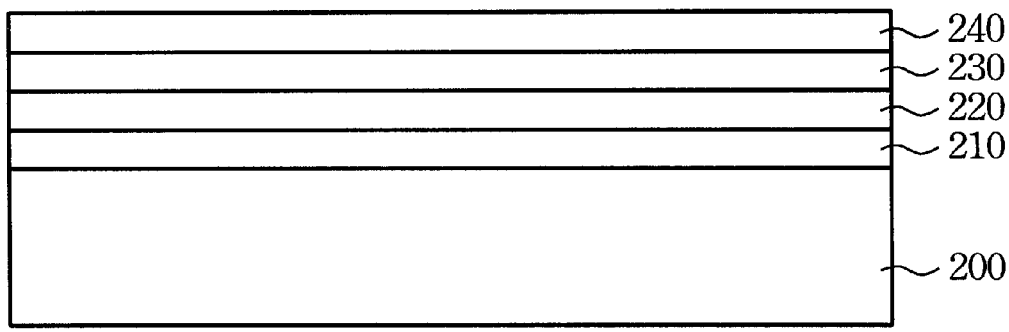
FIG. 4 shows a cross-section view of a substrate having a metal layer thereon, an antireflective layer on the metal layer and passivation layers on the antireflective layer in accordance with the present invention.

As shown in FIG. 4, a metal layer 210 is formed over a semiconductor structure 200. The semiconductor structure 200 can comprise a semiconductor substrate, such as a silicon substrate and can further comprise devices (e.g., source and drain regions) formed in the substrate and devices formed over the substrate, such as gate electrodes, capacitors, insulating layers and conductive layers. The surface of the substrate on which the wiring layer is formed is generally covered with an illustrated insulating layer composed of $SiO_2$, etc. The surface of the substrate or a lower layer of wiring is exposed inside a contact hole provided on a part of the insulating layer. To prevent an increase in contact resistance of an exposed inside a contact hole provided on a part of the insulating layer. To prevent an increase in contact resistance of an exposed inside a contact hole provided on a part of the insulating layer. To prevent an increase in contact resistance of an aluminum or aluminum alloy thin film wiring due to an alloy reaction with a silicon wafer, a so-called barrier metal (not shown) of thin film of Ti, TiN or TiW is preferably provided between the silicon wafer and the aluminum thin film.

An insulating layer (unillustrated) can be formed over the semiconductor structure, the insulating layer composed of silicon oxide formed by a thermal oxidation process at a temperature between about 900° C. and 1100° C. at $O_2$ flow of about 91 and 111 sccm and having a thickness in a range of between about 900 and 1100 angstroms.

Still referring to FIG. 4, a metal layer 210 is formed over a semiconductor structure 200. The metal layer is preferably composed of an Aluminum alloy such as an AlSiCu(98.5% Al, 1% Si, 0.5% Cu) or AlSi alloy (98% Al(+−0.5%), 1% Si(+−0.5%)).

A preferred metal layer 210 is composed of AlSiCu formed by sputter deposition at power between about 5000 and 7000 W (more preferably of about 6000 W), at a pressure between about 2 and 7 mtorr (more preferably at about 5 mtorr), at a temperature between about 90° C. and 110° C. (and more preferably of about 100° C.) and the metal layer preferably has a thickness in a range of between about 4000 and 15000 angstroms.

Referring to FIG. 4, an antireflective layer 220 is formed on the metal layer 210 for reducing light reflectivity during photolithography processes. In a conventional technology, the antireflective layer 220 is formed of TiN material.

Still referring to FIG. 4, a passivation layer is formed on the antireflective layer 220 and it is indicated as a protective layer of the integrated circuits formed in the semiconductor structure 200. The formation of the passivation layer is to firstly deposit a silicon oxide layer 230 on the antireflective layer 220 and then deposit a silicon nitride layer 240 on the silicon oxide layer 230. Thus, the passivation layer consists of the silicon oxide layer 230 and the silicon nitride layer 240. In a conventional technology, the silicon nitride layer 240 and the silicon oxide layer 230 are deposited by using plasma-enhanced chemical-vapor-deposition (PECVD) process.

Figure 5:
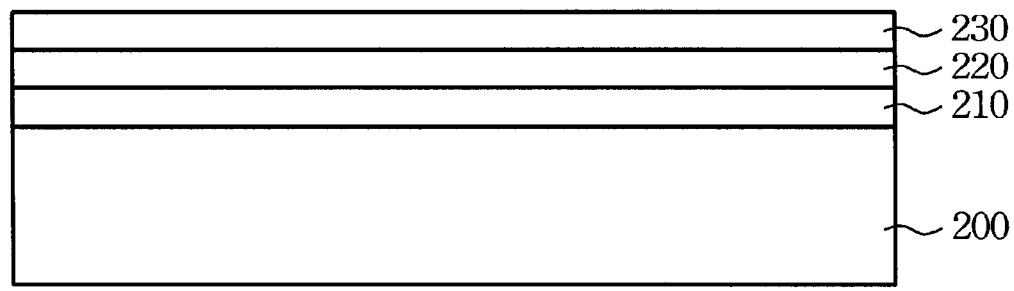
FIG. 5 shows a cross-section view of a substrate in accordance with the present invention after the silicon nitride layer in the passivation layers is removed.

Referring to FIG. 5, the silicon nitride layer 240 is etched in a first etching chamber and it is removed from the surface of the silicon oxide layer 230. In the present invention, the first etching chamber is etching equipment of TEL 4000, which is equipped by Tokyo Electron Limited company. In the first etching chamber, the etching rate of the silicon nitride layer 240 has uniformity less than 10%. The etcher used in the first etching chamber is a mixture gas of $CF_4$ and $O_2$. The flow rate of $CF_4$ in the etcher ranges between about 50 and 200 sccm (more preferably at about 135 sccm). The flow rate of $O_2$ in the etcher ranges between about 10 to 50 sccm (more preferably at about 35 sccm). The pressure in the first etching chamber during the etching process of the silicon nitride layer 240 is maintained at a range between about 200 to 1200 mtorr (more preferably at about 1100 mtorr). The power emitted in the first etching chamber ranges between about 250 and 650 W (more preferably at about 500 W).

Figure 6:
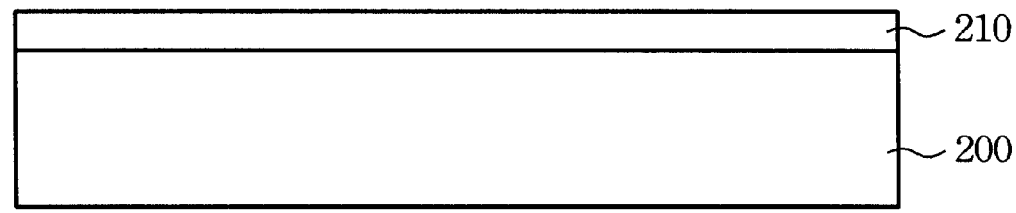
FIG. 6 shows a cross-section view of a substrate in accordance with the present invention after the silicon oxide layer in the passivation and the antireflective layer are removed from the metal layer.

Referring to FIG. 6, the silicon oxide layer 230 and the antireflective layer 220 are etched in a second etching chamber and these layers are removed from the surface of the metal layer 210. The second etching chamber is equipment of TEL5000 that is equipped by Tokyo Electron Limited company. In the second etching chamber, the silicon oxide layer 230 has an etching rate, which has uniformity less than 5%.

In a preferred embodiment of the present invention, the etcher for etching the silicon oxide layer 230 and the antireflective layer 220 in the second etching chamber is a mixture gas of $CHF_3$, $CF_4$, Ar and He. In a case, the $CHF_3$ has a flow rate between about 10 and 100 sccm (more preferably at about 15 sccm), the $CF_4$ has a flow rate between about 10 and 100 sccm (more preferably at about 50 sccm), the Ar has a flow rate between about 100 and 500 sccm (more preferably at about 300 sccm) and the He has a flow rate between about 5 to 50 sccm (more preferably at about 10 sccm). In the present invention, the antireflective layer 220 is formed of TiN material.

In a preferred embodiment of the present invention, the pressure maintained in the second etching chamber ranges between about 200 and 1200 mtorr (more preferably at about 300 mtorr). In a case, the power emitted in the second etching chamber ranges 250 to 1000 W (more preferably at about 800 W).

The silicon oxide layer 230 is completely removed in the second etching chamber because of the uniformity of the etching rate of the silicon oxide layer 230 is good enough and there is no silicon oxide residue on the antireflective layer 220. As the silicon oxide layer 230 is completely removed, the pad discolor effect occurred on the metal layer 210 is prevented.

While the preferred embodiment of the invention has been illustrated and described, it will be appreciated that various changes can be made therein without departing from the spirit and scope of the invention.

What is claimed is:

1. A method to etch passivation layers and an antireflective layer on a substrate, comprising:

forming a metal layer on the substrate;

forming the antireflective layer on the metal layer;

forming the passivation layers on the antireflective layer, wherein the passivation layer consisting of a silicon oxide layer on the antireflective layer and a silicon nitride layer on the silicon oxide layer;

etching the silicon nitride layer in a first etching chamber having a first etcher of $CF_4$ and $O_2$, wherein the silicon nitride layer is etched in a uniformity of less than 10% in the first etching chamber;

etching the silicon oxide layer in a second etching chamber having a second etcher of $CHF_3$, $CF_4$, Ar and He, wherein the silicon oxide layer is etching in a uniformity of less than 5% in the second etching chamber; and etching the antireflective layer in the second etching chamber to expose a surface of the metal layer for metal contacts of integrated circuits.

2. The method according to claim 1, wherein the antireflective layer comprises TiN.

3. The method according to claim 1, wherein the $CF_4$ has a flow rate of 50 to 200 sccm.

4. The method according to claim 1, wherein the $O_2$ has a flow rate of 10 to 50 sccm.

5. The method according to claim 1, wherein the $CHF_3$ has a flow rate of 10 to 100 sccm.

6. The method according to claim 1, wherein the $CF_4$ has a flow rate of 10 to 100 sccm.

7. The method according to claim 1, wherein the Ar has a flow rate of 100 to 500 sccm.

8. The method according to claim 1, wherein the He has a flow rate of 5 to 50 sccm.

9. A method to etch passivation layers and an antireflective layer on a substrate, comprising:

forming the antireflective layer on the substrate;

forming the passivation layers on the antireflective layer, wherein the passivation layer consisting of a silicon oxide layer on the antireflective layer and a silicon nitride layer on the silicon oxide layer;

etching the silicon nitride layer in a first etching chamber having a first etcher of $CF_4$ and $O_2$, wherein the silicon nitride layer is etched in a uniformity of less than 10% in the first etching chamber;

etching the silicon oxide layer in a second etching chamber having a second etcher of $CHF_3$, $CF_4$, Ar and He, wherein the silicon oxide layer is etching in a uniformity of less than 5% in the second etching chamber; and etching the antireflective layer in the second etching chamber to expose a surface of the substrate.

10. The method according to claim 9, wherein the antireflective layer comprises TiN.

* * * * *